United States Patent
Chung

(10) Patent No.: US 10,598,821 B2
(45) Date of Patent: Mar. 24, 2020

(54) LIGHTNING STRIKE ALARM SYSTEM USING BIPOLAR CONVENTIONAL AIR TERMINAL

(71) Applicant: OMNI LPS. CO., LTD., Jincheon-gun, Chungcheongbuk-do (KR)

(72) Inventor: Young Ki Chung, Seoul (KR)

(73) Assignee: OMNI LPS. CO., LTD., Jincheon-gun, Chungcheonbuk-do (KR)

( * ) Notice: Subject to any disclaimer, the term of this patent is extended or adjusted under 35 U.S.C. 154(b) by 178 days.

(21) Appl. No.: 15/575,760

(22) PCT Filed: Jul. 18, 2017

(86) PCT No.: PCT/KR2017/007726
§ 371 (c)(1),
(2) Date: Nov. 20, 2017

(87) PCT Pub. No.: WO2018/016851
PCT Pub. Date: Jan. 25, 2018

(65) Prior Publication Data
US 2018/0239059 A1    Aug. 23, 2018

(30) Foreign Application Priority Data

Jul. 18, 2016 (KR) .................. 10-2016-0090894

(51) Int. Cl.
*G01W 1/16* (2006.01)
*H01L 31/08* (2006.01)
(Continued)

(52) U.S. Cl.
CPC ............... *G01W 1/16* (2013.01); *G01R 1/20* (2013.01); *G01R 29/0842* (2013.01);
(Continued)

(58) Field of Classification Search
CPC . G01W 1/16; H02S 20/20; G01R 1/20; G01R 29/0842; G01R 31/1218;
(Continued)

(56) References Cited

U.S. PATENT DOCUMENTS 5,915,002 A * 6/1999 Shimosako ............ H04M 11/06
                                                                                     379/93.07
6,034,530 A     3/2000 Suzuki et al.
(Continued)

FOREIGN PATENT DOCUMENTS

CN        101512855 A      8/2009
CN        203941224 U      11/2014
(Continued)

*Primary Examiner* — Patrick Assouad
*Assistant Examiner* — Feba Pothen
(74) *Attorney, Agent, or Firm* — Novick, Kim & Lee, PLLC; Sang Ho Lee

(57) ABSTRACT

A lightning strike alarm system using a Bipolar Conventional Air Terminal (BCAT) is provided. The lightning strike alarm system using BCAT including a rod element to which a ground charge is electrified and an electrification plate-cone or an electrification plate-tube electrified by a thunderstorm cloud, includes a luminescence unit to be electrically connected to the rod element and the electrification plate-cone or the electrification plate-tube and emits light by electric energy electrified to the electrification plate-cone or the electrification plate-tube by the thunderstorm cloud. The lightning strike alarm system enables a user to find that an impulse current of the thunderstorm is normally and safely flown to the ground, and thus, the user may have psychological security.

6 Claims, 8 Drawing Sheets

(51) Int. Cl.
*H02S 20/20* (2014.01)
*G01R 29/08* (2006.01)
*G01R 1/20* (2006.01)
*G08B 21/10* (2006.01)
*G08B 21/18* (2006.01)
*G08B 25/08* (2006.01)
*G01R 31/12* (2020.01)

(52) U.S. Cl.
CPC ......... *G01R 31/1218* (2013.01); *G08B 21/10* (2013.01); *G08B 21/18* (2013.01); *G08B 25/08* (2013.01); *H01L 31/08* (2013.01); *H02S 20/20* (2014.12); *Y02A 50/12* (2018.01)

(58) Field of Classification Search
CPC ........ G08B 21/10; G08B 21/18; G08B 25/08; H01L 31/08; Y02A 50/12
See application file for complete search history.

(56) References Cited

U.S. PATENT DOCUMENTS

| | | | |
|---|---|---|---|
| 6,107,804 A | 8/2000 | Suzuki et al. | |
| 7,041,895 B1 | 5/2006 | Kim | |
| 8,451,575 B2 | 5/2013 | Chung | |
| 8,754,630 B2 * | 6/2014 | Voisine | G01R 11/02 |
| | | | 324/74 |
| 9,660,433 B2 | 5/2017 | Chung | |
| 2014/0062312 A1 * | 3/2014 | Reed | H05B 37/0218 |
| | | | 315/158 |
| 2015/0122527 A1 * | 5/2015 | Chung | H02G 13/00 |
| | | | 174/3 |

FOREIGN PATENT DOCUMENTS

| | | |
|---|---|---|
| CN | 104638521 A | 5/2015 |
| CN | 204631100 U | 9/2015 |
| CN | 105305233 A | 2/2016 |
| JP | 11-006850 A | 1/1999 |
| KR | 10-0230628 B1 | 11/1999 |
| KR | 10-0463438 B1 | 12/2004 |
| KR | 10-0787569 B1 | 12/2007 |
| KR | 10-1491414 B1 | 2/2015 |
| KR | 10-2015-0037135 A | 4/2015 |
| KR | 10-1606925 B1 | 3/2016 |

* cited by examiner

LIGHTNING STRIKE ALARM SYSTEM USING BIPOLAR CONVENTIONAL AIR TERMINAL

TECHNICAL FIELD

The present disclosure relates to a lightning strike alarm system using a Bipolar Conventional Air Terminal (BCAT), which is installed on the BCAT and reduces the probability of lightning strikes by inhibiting an increase of an electric field caused by earth potential when thunderclouds approach.

BACKGROUND ART

With the increase in intensity of typhoons and local heavy rain due to global warming, the frequency of lightning strikes has increased accordingly. As lightning strike damage increases along with an increase in outdoor activities such as golf and mountain climbing, related countermeasures are required.

A thunderstorm cloud which causes lightning, is electrically charged and includes an upper portion made of ice crystals having positive electric charges and a lower portion made of water droplets having negative electric charges. A thunderstorm is a phenomenon in which thunderstorm charge is discharged to the earth through air insulation breakdown. In this process, an electromagnetic field is generated and propagates through the atmosphere. A technique of analyzing positions of thunderclouds may be used to predict thunderstorm activity, movement paths of thunderstorm clouds, and lightning strike occurrences, and therefore, is adopted in meteorological observations and preventing lightning strike damage in various fields such as meteorological observations for launching spacecraft, setting safety measures for building structures and electric power facilities, and ensuring security on golf courses and in playgrounds.

A lightning strike alarm system is equipment which may be used to decrease loss of life by predicting and issuing alerts in order to prevent damage from the lightning strikes in advance. In general, conventional lightning strike alarm systems issue alerts or predict lightning strikes by measuring ground electric fields. In these cases, the lightning strike alarm systems use high frequency and low frequency interference phenomenon, issue alarms by performing local electrical field sensing, or issue an alarm when lightning strikes a Franklin lightning rod.

However, the conventional art just have functions of sensing and issuing alarms when using the interference phenomenon or local alert sensors. Also, since the Franklin alarm system includes lightning strike induction, there is a high possibility that people nearby may be hurt.

DETAILED DESCRIPTION OF THE INVENTION

Technical Problem

In order to solve the above-mentioned problems, the present disclosure is directed to providing a lightning strike alarm system using a Bipolar Conventional Air Terminal (BCAT) for warning of a danger of lightning strikes by measuring a voltage induced in a discharge shade as a thunderstorm cloud approaches so that the BCAT may lower a probability of lightning strikes by alleviating a voltage increase due to the approach of the thunderstorm cloud by using a corona discharge method.

Technical Solution

In order to achieve the objectives mentioned above, the present disclosure is related to a lightning strike alarm system using a corona discharge method including a rod element to which a ground charge is electrified by a thunderstorm cloud, including: a sensor, which is electrically connected to a rod element and an electrification plate-cone or an electrification plate-tube (hereinafter referred to as "a discharge shade" for convenience of explanation) and measures electric energy induced in the electrification plate-cone or the electrification plate-tube discharge shade by the thunderstorm cloud; and a controller which determines that the thunderstorm has approached when the electric energy measured by the sensor unit is greater than a reference energy set in advance.

Also, in the lightning strike alarm system using the BCAT of the present disclosure, the sensor includes: a luminescence unit which is electrically connected to the rod element and the electrification plate-cone or the electrification plate-tube and emits light by the electric energy induced in the electrification plate-cone or the electrification plate-tube by the thunderstorm cloud; and a light receiver which receives the light emitted from the luminescence unit and converts the light to electric energy and transfers the converted electric energy to the control unit.

Also, the present disclosure is related to the lightning strike alarm system using the BCAT, wherein the luminescence unit includes light emitting devices with different polarities connected in parallel so that all the light emitting devices may emit light even when currents of different polarities are input.

Also, the present disclosure is related to the lightning strike alarm system using the BCAT, wherein the sensor unit further includes: a light shielding block which accommodates the luminescence unit and the light receiving unit, maintains an electric contact between the rod element and the electrification plate-cone or the electrification plate-tube, and supplies electric energy induced in the electrification plate-tube or the electrification plate-tube; a locking bolt forming a removable tensioning groove for fixing and supporting an end of the light shielding block; and a spring which is installed in the removable tensioning groove and elastically supports the light shielding block.

Also, the present disclosure is related to the lightning strike alarm system using the BCAT, where light shielding block binding units having protruding structures and configured to protect and cover the light shielding block and the locking bolts, are arranged in a circumferential direction of the electrification plate-cone or the electrification plate-tube.

The present disclosure is related to the lightning strike alarm system using the BCAT, wherein a fastening device which is complimentarily removably attached to the electrification plate-cone or the electrification plate-tube is arranged in the light shielding block binding units.

The present disclosure is related to the lightning strike alarm system using the BCAT, wherein a terminal piece accommodation groove that accommodates a terminal piece on an end of the light shielding block in a length direction within is arranged in a circumferential direction of the rod element in the light shielding block binding unit.

Advantageous Effects of the Invention

As described above, by measuring electric energy of the thunderstorm cloud formed on the electrification plate-cone or the electrification plate-tube when the thunderstorm cloud approaches by using an induced voltage generated from a discharge shade of the BCAT, a lightning strike may be predicted as the thunderstorm cloud approaches, an alert may be issued, thereby decreasing potential loss of life.

BEST MODE

Mode of the Invention

Figure 1:
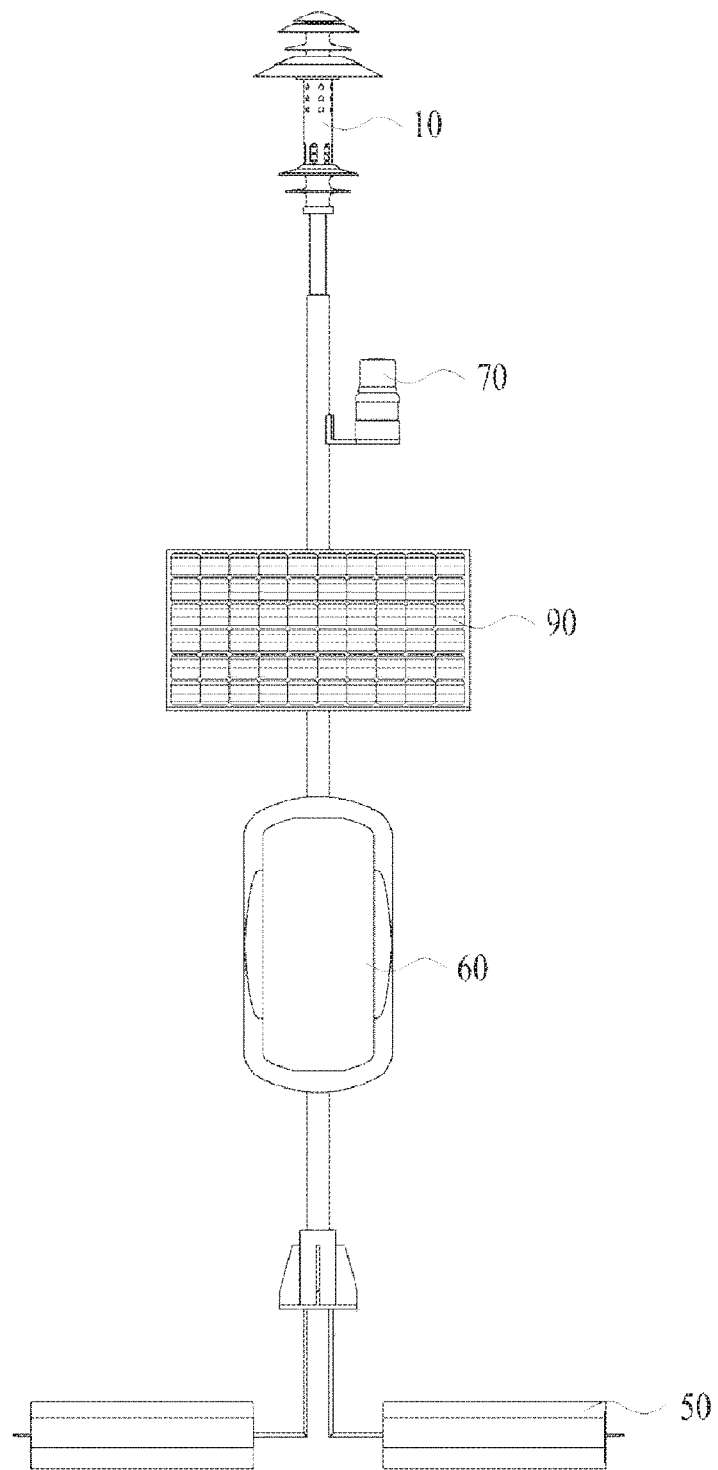
FIG. 1 is a block diagram illustrating an entire structure of a lightning strike alarm system using a Bipolar Conventional Air Terminal (BCAT), according to an embodiment of the present disclosure.

Hereinafter, details of embodiments of the present disclosure will be described according to attached drawings.

Also, in the descriptions of the present disclosure, like reference numerals may be used to represent like elements, and repeated explanations will be omitted.

First, an example embodiment of the present disclosure will be described in detail with reference to FIG. 1.

A lightning strike alarm system using a Bipolar Conventional Air Terminal (BCAT) includes a discharging and lightning strike receiving unit 10 including the BCAT, a sensor 40 to detect a voltage of a corona discharge, and, a controller to control issuing of lightning strike alarms according to levels of measured voltages, a power supply 90 to supply power. The lightning strike alarm system may further include an alarm unit 70 to issue alarms, a data recorder 80 to record the issued alarms, the measured voltages, and values of electric fields. Also, a ground contact part 50 is installed in the ground.

First, the discharging and lightning strike receiving unit 10 includes the BCAT (or a Bipolar Lightning Strike Arrester) to perform a corona discharge and receives lightning strikes in order to prevent a grounding voltage from increasing when the thunderstorm cloud approaches. Hereinafter, the term "discharging and lightning strike receiving unit" 10 may be mixed with the term "BCAT". The discharging and lightning strike receiving unit 10 (or the BCAT) "includes an electrification plate-cone 200 or an electrification plate-tube 300 electrified by the thunderstorm clouds, and a rod element 100 to which a ground electric charge is electrified.

Also, insulators 110 for insulation between the electrification plate-cone 200 and the electrification plate-tube 300 are installed on the rod element 100. Accordingly, the rod element 100 and the electrification plate-cone or the electrification plate-tube 300 are insulated from each other. When a lightning strike occurs due to a thunderstorm cloud, an impulse current of the lightning strike safely flows to the ground via the rod element 100.

The sensor unit 40 transforms electrical energy induced in the electrification plate-cone 200 or the electrification plate-tube 300 (hereinafter referred to as a discharge shade into light and then converts the light into a voltage.

The sensor unit 40 includes a luminescence unit 410 to emit light by using a voltage generated on the discharge shade and a light receiver 450 to receive the light emitted from the luminescence unit 410.

The luminescence unit 410 is electrically connected to the rod element 100 and the electrification plate-cone 200 or the electrification plate-tube 300 and emits light by electrical energy induced in the electrification plate-cone 200 or the electrification plate-tube 300 by the thunderstorm cloud. The light receiving unit 450 receives the light emitted from the luminescence unit 410 and transmits an output signal (an output voltage or output current) to the control unit 60. In this case, a level of the output voltage or output current is determined in proportion to an intensity of the light.

Next, the control unit 60 controls an issue of a lightning strike alarm according to a level of the measured voltage. That is, the control unit 60 converts the voltage received from the sensor unit 40 to an electric field value, and when the electric field value exceeds a reference value set in advance, the control unit 60 determines that the lightning strike has occurred. When the electric field value is higher than the reference value, the control unit 60 may issue an alarm signal.

The power supply unit 90 supplies power to the discharging and lightning strike receiving unit 10, the sensor unit 40, and the control unit 60. The power supply unit 90 may include a solar panel and a battery. In other words, the power supply unit 90 may include a solar panel to autonomously produce and supply power in order to operate a system when installed outdoors where the power is not easily supplied.

The alarm unit 70 is an alarm device including an alarm light or a buzzer. Alternatively, the alarm unit 70 may transmit alarm contents to a control server (not shown) or a terminal of a person in charge (such as a mobile terminal) (not shown) through wired or wireless communication.

The data recording unit 80 records data regarding the electric field value converted by the alarm unit 70 or the control unit 60. In other words, the data recording unit 80 calculates and records voltages or currents of the corona discharge measured by the sensor unit 40 according to a regular cycle or an event set in advance. The ground contact part 50 includes a ferrite earth module to maintain a low earth resistance.

Next, the discharging and lightning strike receiving unit 10 according to an embodiment of the present disclosure will be described in more detail with reference to FIG. 2.

Figure 2:
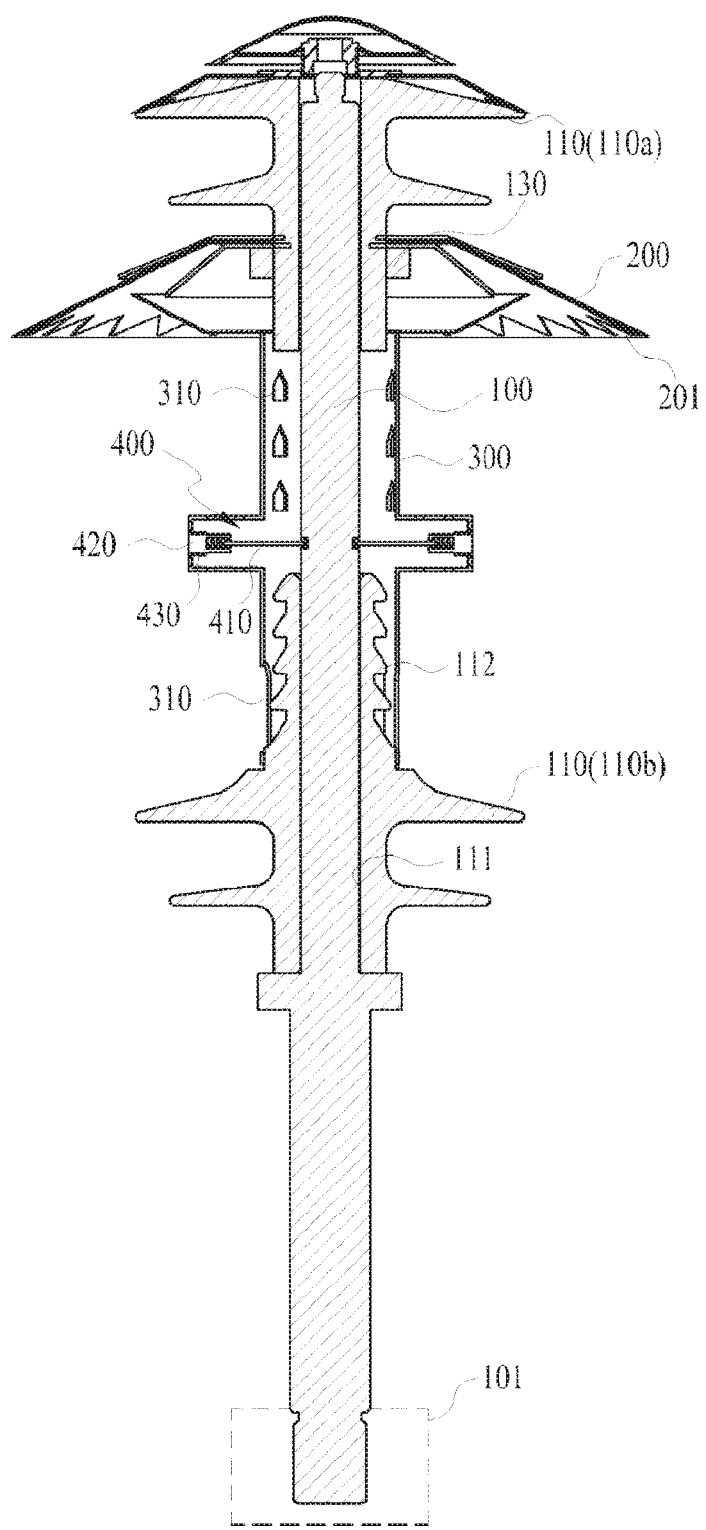
FIG. 2 is a cross-sectional view illustrating the lightning strike alarm system using the BCAT, according to an embodiment of the present disclosure.

As illustrated in FIG. 2, the discharging and lightning strike receiving unit 10 includes the rod element 100 to which the ground charge is electrified, the electrification plate-cone 200 or the electrification plate-tube 300 electrified by the thunderstorm cloud. Also, the sensor unit 40 is electrically connected to the rod element 100 and the electrification plate-cone 200 or the electrification plate-tube 300 and emits light by electrical energy electrified (which will be referred to as "induced" for more convenient explanation) to the electrification plate-cone 200 or the electrification plate-tube 300 due to lightning strikes. The discharging and lightning strike receiving unit 10 illustrated in FIG. 2 has also been disclosed in detail in Patent Application No. 10-2015-0112447 of the applicant.

First, the rod element 100 is elongated to a certain length to be installed perpendicularly to an outdoor surface and induces the ground charge.

Also, a fixing plate 101 may be further provided on a lower end of the rod element 100 to stably fix the rod element 100 and broaden a contact area of the rod element 100 with the ground. As the fixing plate 101 is a flat plate type element with a certain thickness, a fastening device (not shown) may be installed on a surface of the fixing plate 101 so that the fixing plate 101 may be firmly fixed onto the ground or a building structure. Also, the lower end of the rod element 100 contacts the ground contact part 50.

Also, the insulators 110 for insulation between the rod element 100 and the electrification plate-cone 200 and the electrification plate-tube 300 to be described hereinafter are installed on one side and another side in a length direction of the rod element 100.

As insulating elements made of ceramic or synthetic resin, the insulators 110 include a first insulator 110*a* installed on an upper portion of the rod element 100 and a second insulator 110*b* installed on a lower portion of the rod element 100. A penetration hole 111 through which the rod element 100 is fixed is formed on the second insulator 110*b*, and an insulation protuberance 112 to be inserted into the electrification plate-tube 300 are formed around a radius of an outer circumference of the penetration hole 111.

The insulation protuberance 112 has a certain length in order to secure an insulation distance between the electrification plate-tube 300 and the rod element 100 and guides raindrops that have fallen into the electrification plate-tube 300 due to wind to be easily emitted to an external area of the electrification plate-tube 300. Therefore, the insulation protuberance 112 has a structure in which a plurality of cone-shaped elements with narrow upper portions and wide lower portions are collinearly connected in a row.

Also, the electrification plate-cone 200 is installed on an upper end in a length direction of the rod element 100, below the first insulator 110*a*. The electrification plate-cone 200, which remains electrically insulated from the rod element 100 and is electrically connected to the electrification plate-tube 300, is a component to which a voltage of a polarity opposite to the grounding charge is applied.

In addition, corrugations 201 may be repeatedly formed on an edge in a circumferential direction of the electrification plate-cone 200. The corrugations 201 may be used for inducing equal distributions of discharge with respect to the circumferential direction of the electrification plate-cone 200.

Such a configuration of the electrification plate-cone 200 facilitates discharge between the thunderstorm cloud and the ground by concentrating the electric field when there is a lightning strike.

The electrification plate-tube 300 is located in a portion in the length direction of the rod element 100, that is, between the first insulator 110*a* and the second insulator 110*b*, electrically connected to the electrification plate-cone 200, and is charged with a polarity opposite to the polarity of the grounding charge. The electrification plate-tube 300 may have the form of a tube and form a hollow so that the rod element 100 may be attached to the center of the electrification plate-tube 300.

Also, a supporting unit 130 to support the electrification plate-cone 200 and the first insulator 110*a* is installed above the rod element 110.

Also, a plurality of penetration grooves 310 with a uniform size are formed on an upper portion and a lower portion in a circumferential direction of the electrification plate-tube 300.

The sensor unit 40, which is electrically connected to the rod element 100 and the electrification plate-cone 200 or the electrification plate-tube 300, emits light by electric energy being induced in the electrification plate-cone 200 or the electrification plate-tube 300 by the thunderstorm cloud, receives the emitted light and converts the light into a voltage via a photodiode (PD), and transmits the voltage to the control unit 60.

Figure 3:
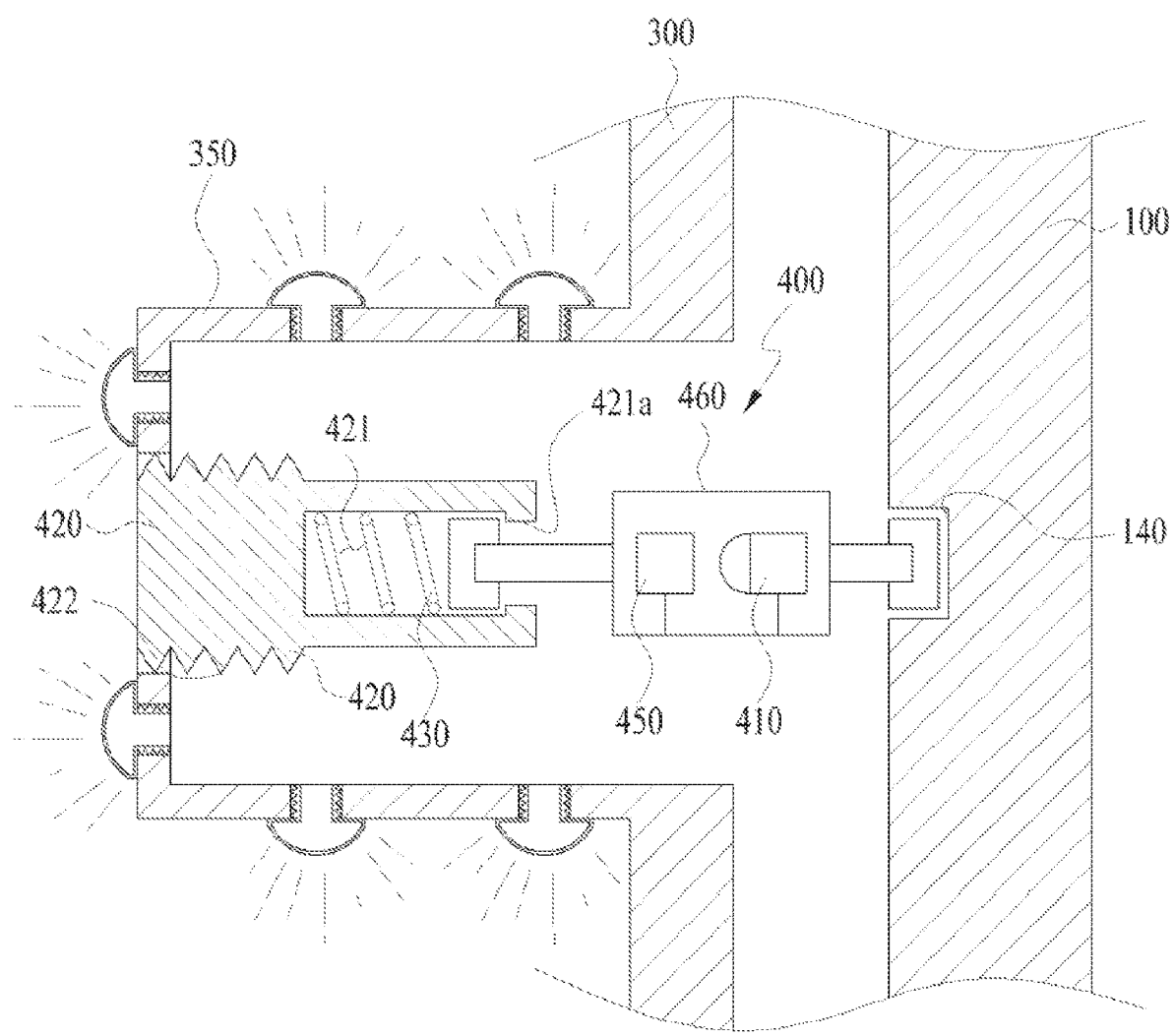
FIG. 3 is an enlarged view illustrating configuration of a sensor unit in FIG. 2.

Next, a configuration of the sensor unit 40 according to a first embodiment of the present disclosure will be described in detail with reference to FIG. 3.

As described above, the sensor unit 40 is installed between the rode element 100 and the electrification plate-cone 200 or the electrification plate-tube 300.

The sensor unit 40 detects an emission of the light due to the voltage induced in the discharge shade and a level of the voltage due to an approach of the thunderstorm cloud, thereby determining whether the thunderstorm cloud is approaching. In other words, by emitting the light and detecting the impulse current of the lightning strike before its occurrence, it is possible to recognize that the impulse current of the lightning strike flows safely to the ground via the BCAT. On the contrary, if the sensor unit 40 does not detect the approaching thunderstorm cloud, a grounding error between the rod element 100 and the ground may be detected. Therefore, by taking immediate action, building fires, structural damage, and loss of life due to lightning strikes may be prevented, and the inconvenience and necessity of periodic inspection work in which a worker has to climb up to a narrow installation site and check operation of a lightning strike arrester despite it operating normally may be avoided.

In an embodiment, the sensor unit 40 includes: the luminescence unit 410 to maintain an electrical contact with respect to the rod element 100 and the electrification plate-cone 200 or the electrification plate-tube 300 and perform a flickering operation; a locking bolt 420 to form a removable tensioning groove 421 to fix and support an end of the luminescence unit 410; a spring 430 to be installed within the removable tensioning groove 421 and elastically support the luminescence unit 410; and a light receiving unit 450 to receive the light limited from the luminescence unit 410, convert the light to a current or a voltage, and output the current or the voltage. Also, the sensor unit 40 may further include a light shielding block 460 installed around the sensor unit 40 to block light from and to an exterior area.

The luminescence unit 410 and the light receiving unit 410 are provided in the light shielding block 460.

The luminescence unit 410 includes light emission diodes (LEDs), and may also include LEDs including voltage stabilizers disclosed in the present field. Also, a discharge tube (also referred to as "an arc tube") used for a mercury lamp, a metal halide lamp, etc. may be used for the luminescence unit 410.

Each of terminal pieces 411*a* and 411*b* is formed on each of two ends of the light shielding block 460 in order to facilitate electric flows. The terminal piece 411*a* installed on one end of the light shielding block 460 contacts the rod element 100 and the terminal piece 411b installed on another end of the light shielding block contacts the electrification plate-cone 200 or the electrification plate-tube, thereby maintaining electric connections.

The locking bolt 420 is screwed to penetrate the electrification plate-cone 200 or the electrification plate-tube 300. A locking thread unit 422 is formed in an outer circumference direction, and the removable tensioning groove 421 to fix and support an end of the luminescence unit 410 is formed on an end of the locking bolt 420.

A locking jaw 421a to be locked with respect to the terminal piece 411b of the luminescence unit 410 is formed on an open face of the removable tensioning groove 421. The locking bolt 420 is made of metal to facilitate electric conductivity.

The spring 430 is installed in the removable tensioning groove 421 and elastically supports the light shielding block 460 fixed to the removable tensioning groove 421. In other words, the spring 430 protects the light shielding block 460 from damage due to external shocks and stabilizes electric connections of the light shielding block 460.

Also, a terminal piece accommodation groove 140 to accommodate the terminal piece 411a of the light shielding block 460 within is formed in a circumference direction of the rod element 100. The terminal piece 411a may maintain a stable connection state without floating by forming the terminal piece accommodation groove 140. The terminal piece 411a of the light shielding block 460 may be installed to contact on a side to an outer circumferential surface of the rod element 100.

Also, desirably, light shielding block locking units 350 with protruding structures to protect and cover the light shielding block 460 and the locking bolt 420 may further be arranged in a circumferential direction of the electrification plate-cone 200 or the electrification plate-tube 300.

A location in which the sensor unit 40 is installed may be more clearly recognized by using the light shielding block locking unit 350.

Figure 4:
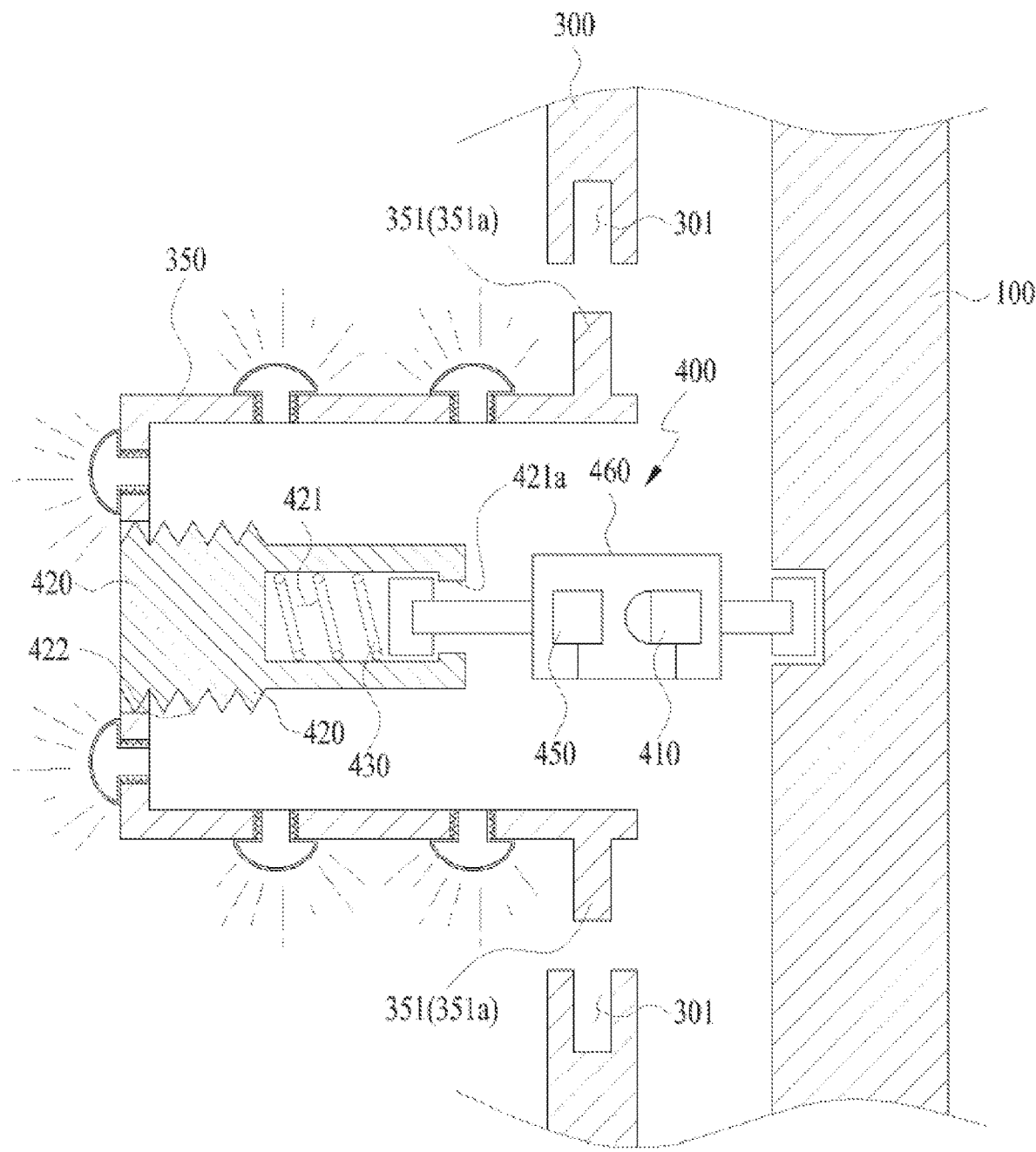
FIG. 4 is an enlarged view illustrating another embodiment of a shade block binding unit included in the sensor unit in FIG. 2.

Also, FIG. 4 illustrates another embodiment of the light shielding block locking unit 350, in which a fastening device 351 that is complementarily removably attached to the electrification plate-cone 200 or the electrification plate-tube 300.

In an embodiment, the light shielding block locking unit 350 includes a first locking joint gadget 351a and a second locking joint gadget 351b so that the electrification plate-cone 200 or the electrification plate-tube 300 may be locked in an upward direction and a downward direction having the light shielding block locking unit 350 in between, and each of locking grooves 301 to be locked to the first locking joint gadget 351a and the second locking joint gadget 351b is respectively arranged on the electrification plate-tube 200 or the electrification plate-tube 300.

Also, the light receiving unit 450 in the light shielding block 460 is installed to face the luminescence unit 410, and may include a photodiode (PD). Output signals from the PD are consecutively transmitted to the control unit 60. In the output signals from the PD, the current or voltage increases in proportion to an intensity of the light emitted from the luminescence unit 410. Accordingly, when an intensity of the current or the voltage of the light receiving unit 450 or the PD is greater than an intensity set in advance, the control unit 60 detects the approach of the thunderstorm cloud.

Next, a configuration of the sensor unit 40 according to a second embodiment of the present disclosure will be described. In the first embodiment, the luminescence unit 410 and the light receiving unit 450 of the sensor unit 40 are connected to the locking bolt 420, however, the luminescence unit 410 and the light receiving unit 450 are installed inside or adjacent to the control unit 60. That is, a wire (lead wire) to be connected to the electrification plate-cone 200 or the electrification plate-tube 300 and the rod element 100 is pulled out to a location on which the sensor unit 40 is installed, and is connected to an input terminal 400 of the luminescence unit 410 included in the sensor unit 40.

Next, a configuration of a circuit of the sensor unit 40 and the control unit 60 according to an embodiment of the present disclosure will be described with reference to FIG. 5.

Figure 5:
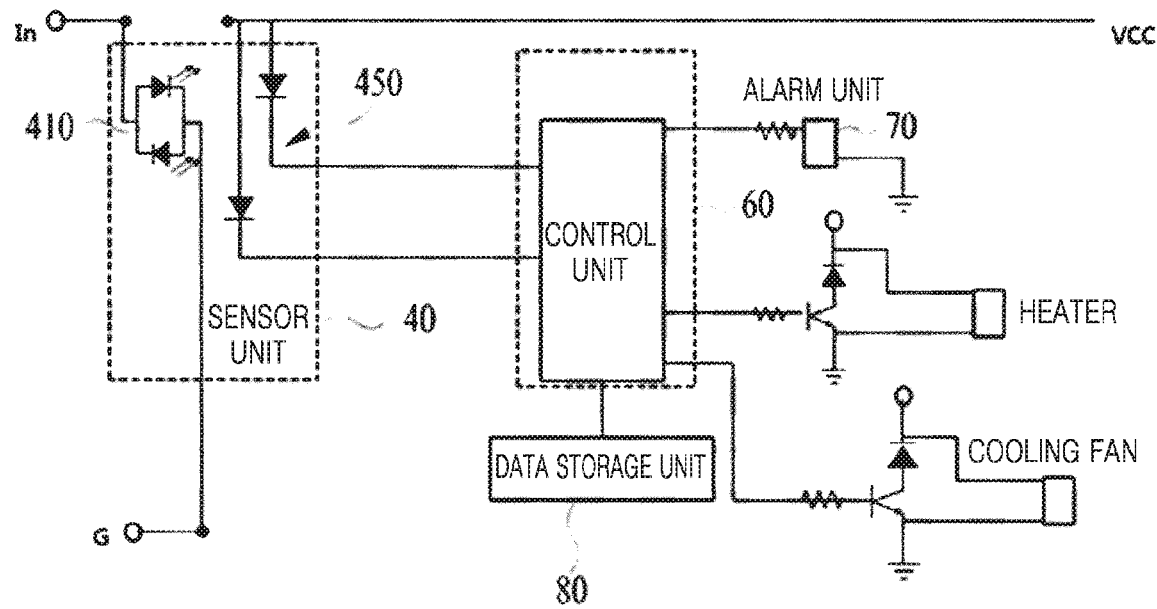
FIG. 5 is a circuit diagram with respect to the sensor unit and a control unit, according to an embodiment of the present disclosure.

As illustrated in FIG. 5, the sensor unit 40 is connected by an input power source In 1 and ground G, the input power source In 1 is electrically connected to the electrification plate-cone 200 or the electrification plate-tube 300, and the ground G is electrically connected to the rod element 100. In other words, a power source for the luminescence unit 410 of the sensor unit 40 is electrical power induced in the electrification plate-cone 200 or the electrification plate-tube 300, and the supplied electrification power contacts the ground through the rod element 100.

The sensor unit 40 includes the luminescence unit 410 and changes the electrical power or the voltage induced by the thunderstorm cloud into light. In other words, the sensor unit 40 changes the voltage generated by the corona discharge of the BCAT into light.

Optical conversion is required because, even though a measurement circuit will not be harmed on a low voltage, a high voltage may be induced in the measurement circuit and cause circuitry to be harmed when the BCAT receives the lightning strike. That is, a linear change of amounts of light with a purpose of insulation according to voltage increase of the LEDs may be measured, converted again into voltages via a photo sensor, and input to a control circuit.

Figure 6:
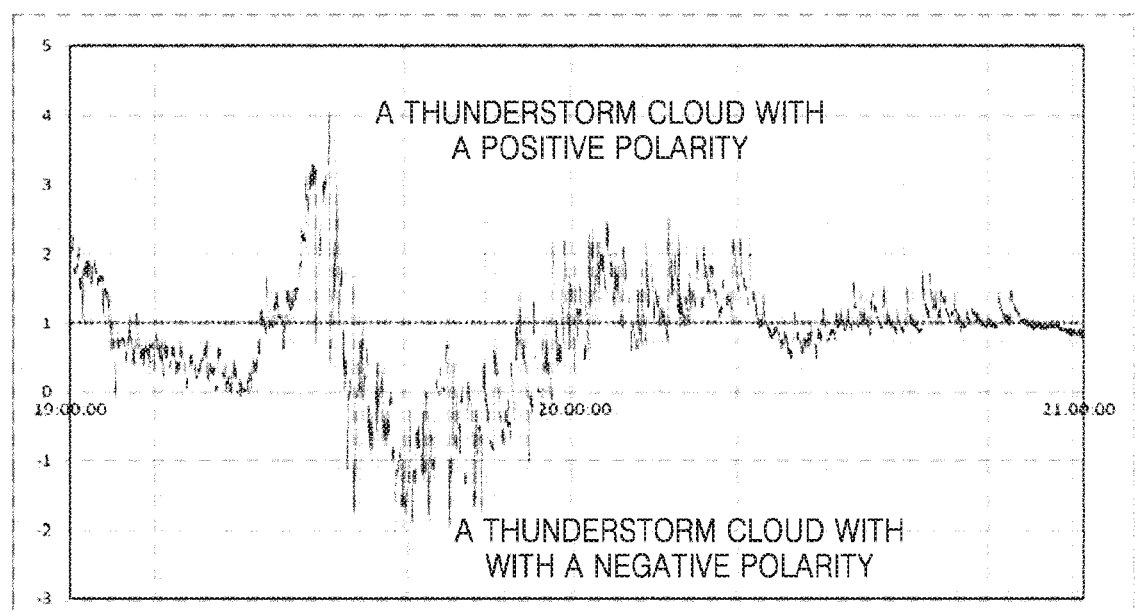
FIG. 6 is a graph illustrating currents or voltages generated from a positive polarity portion and a negative polarity portion of the thunderstorm cloud, according to an embodiment of the present disclosure.

Also, the luminescence unit 410 includes LEDs with different polarities connected in parallel so that all the LEDs may emit light even when currents of different polarities are input. The thunderstorm cloud is sorted into a positive polarity portion and a negative polarity portion as illustrated in FIG. 6. A field-mill type sensor may perform polarity assortment, however, a general Franklin air terminal type of lightning strike monitoring system may not easily perform the polarity assortment. Accordingly, the luminescence unit 410 may be a circuit device for detecting different polarities, and in a light transformation unit, a positive polarity device is operated with respect to the thunderstorm cloud having a positive polarity, and a negative polarity device is operated with respect to the thunderstorm cloud having a negative polarity.

The light receiving unit 450 includes devices such as the PDs, and the output voltage or the output current increases depending on the intensity of the light emitted from the luminescence unit 410.

When the voltage input from the sensor unit 40 is higher than a reference voltage, the control unit 60 immediately sends a warning signal to the alarm unit 70. A measured value generated in this case may be transferred to a data storage unit 80 and recorded as relevant data.

The alarm unit 70 receives the input signal and operates the alarm light, and at the same time, lets out a buzzer sound, thereby warning of danger.

A data storage unit 80 stores the measured signal value as the electric field value (KV/M) together with time data.

Also, as the lightning strike alarm system according to the present disclosure is installed outdoors, it is highly influenced by the lifetime and stability of operation of the circuit device due to environmental circumstances. To deal with effects on temperature, when the temperature is higher or lower than a certain level, a cooling fan and a heater may be operated.

Next, operations of the lightning strike alarm system according to an embodiment of the present disclosure will be described with reference to FIG. 7.

Figure 7:
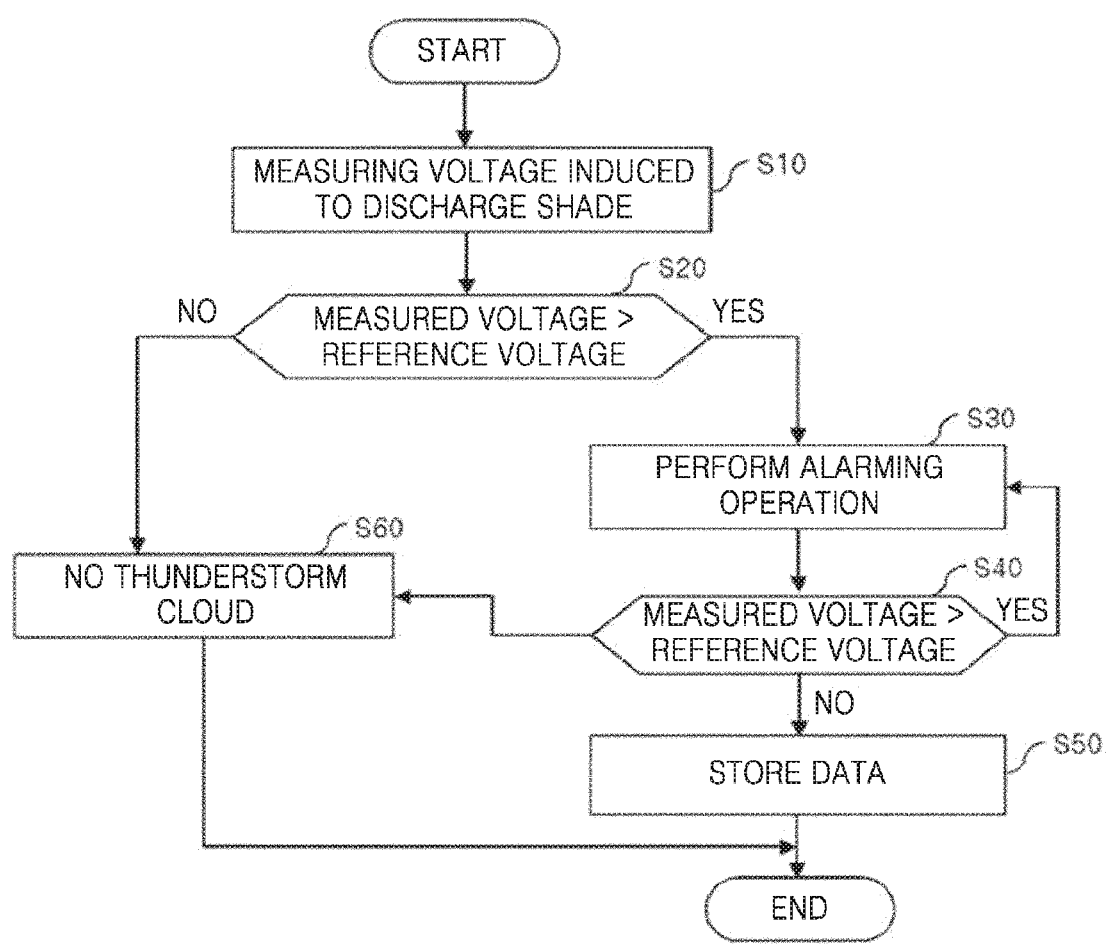
FIG. 7 is a flowchart illustrating operations of the lightning strike alarm system using the BCAT, according to an embodiment of the present disclosure.

As illustrated in FIG. 7, first, the BCAT monitors a voltage increase due to the approach of a thunderstorm cloud (S10). Also, the sensor unit 40 may operate due to the approach of the thunderstorm cloud.

Next, the control unit 60 detects an output from the sensor unit 40 and compares the output with a reference value (a reference voltage) set in advance (S20). When the output is greater than the reference value, it is determined that the thunderstorm cloud is approaching (S30). When it is determined that the thunderstorm cloud is approaching, that is, when the input is 1, an operation signal is transmitted to the alarm unit 70.

Also, after the operation signal is transmitted to the alarm unit 70, the sensor unit continually detects outputs (S40). While the sensor unit 40 continually outputs signals, the control unit 60 continually operates the alarm unit 70. Also, in this case, generated data is stored (S50).

Also, when it is determined that the thunderstorm cloud has not approached, the alarm unit 70 is released from control (S60). That is, when it is determined that there is no signal, the alarm unit 70 is released from control.

Results of a simulation, performed in order to check whether there is a voltage induced in the discharge shade according to the approach of the thunderstorm cloud, are described below.

Figure 8:
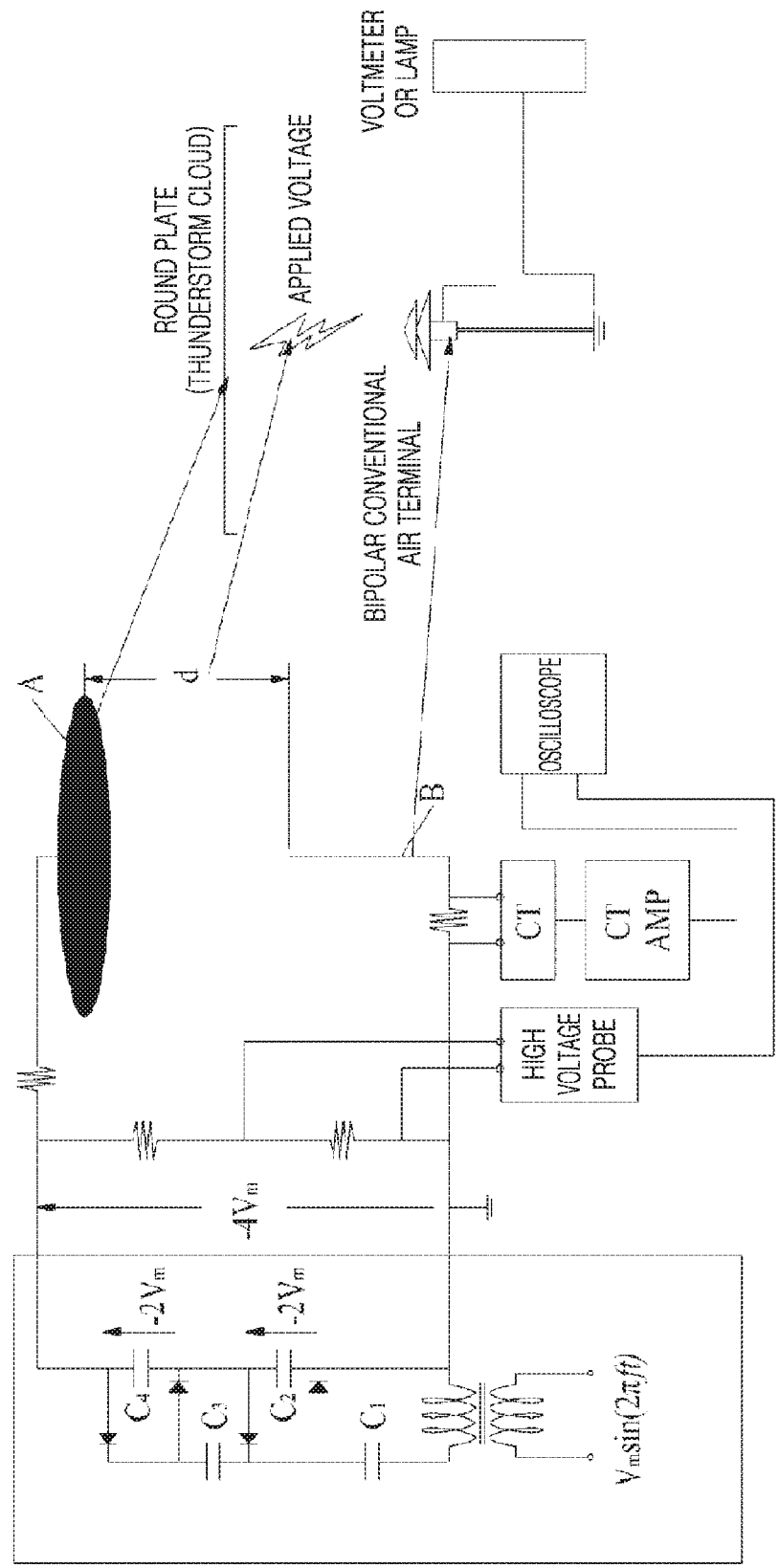
FIG. 8 is a drawing illustrating an experimental apparatus used for measuring a voltage induced between a discharge shade and a rod element.
Figure 9:
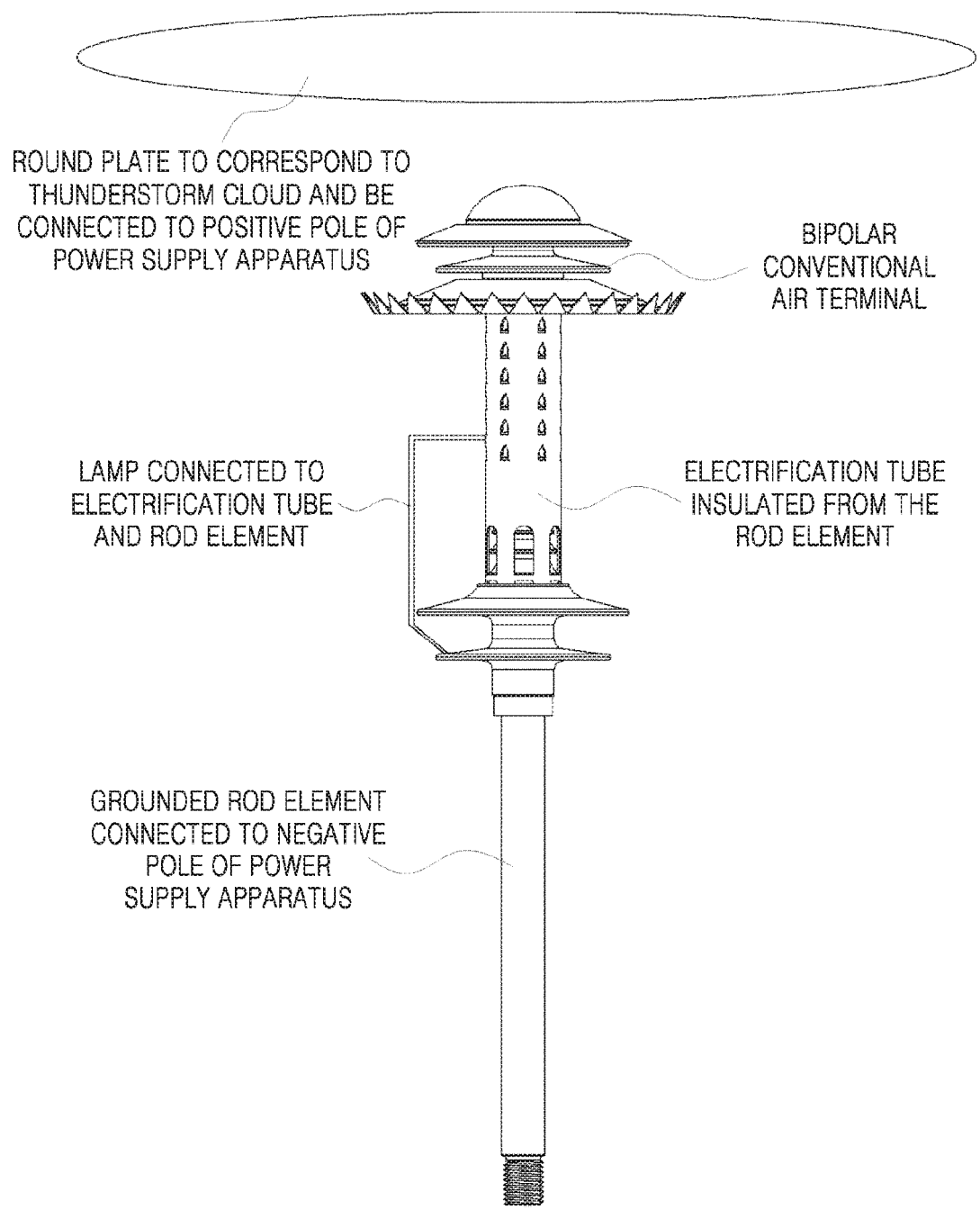
FIG. 9 is a picture showing the experimental apparatus used for measuring the voltage induced between the discharge shade and the rod element.

FIG. 8 illustrates an experimental apparatus to connect the BCAT to a high voltage supply apparatus, apply a voltage between a round plate and the BCAT, and measure a level of the voltage induced between the discharge shade and the rod element 100. The high voltage supply apparatus is a well-known apparatus widely used in a high voltage field, which is used in voltage breakdown tests using round plates and needle-electrodes.

When the BCAT applied in the present disclosure and a round plate replacing the thunderstorm cloud is connected to an output terminal of a high voltage supply apparatus and the voltage is induced between the grounded rod element and the round plate of the BCAT that is grounded, A voltage of a voltmeter used to detect a level of the voltage induced between the grounded rod element of the BCAT and the electrification plate-tube or the electrification plate-cone (the discharge shade) insulated from the grounded rod element (or a lamp to check a luminescence state) is measured, and results of the measurement is shown in Table 1 below. That is, it may be recognized that the voltage is induced between the grounded rod element 100 of the BCAT and the electrification plate-tube or the electrification plate-cone (the discharge shade) insulated from the grounded rod element 100 when the thunderstorm cloud approaches and thus the luminescence unit 410 emits the light.

TABLE 1

| distance between round plate and lightning rod (d) | 20 cm(diameter of round plate: 200 cm) | | | | |
| --- | --- | --- | --- | --- | --- |
| applied voltage | 70 kV | 80 kV | 90 kV | 100 kV | 110 kV |
| terminal voltages on two ends of lamp in state when discharge tubes (lamp operated by charges) for stability of measure (V) | 2.25 | 2.36 | 2.43 | 2.47 | 2.49 |
| measured voltage value (when lamp is open) (V) | 28 | 74 | 205 | 410 | 670 |
| conversion of electric field value | 350 kV/m | 400 kV/m | 450 kV/m | 500 kV/m | 550 kV/m |

In the above table, the lamp is a luminescence tube used for an AC220V natrium discharge lamp available on the market and disclosed in the present disclosure.

As described above, according to the present disclosure, when the electrification plate-cone 200 or the electrification plate-tube 300 is electrically connected to the sensor 40, and the sensor unit 40 detects the electrification thereof, the control unit 60 controls the alarm unit to issue an alarm signal, and thus, a grounded state of the BCAT may be clearly confirmed as well as whether the BCAT is operating normally.

While the present disclosure has been described in detail according to embodiments, the present disclosure is not limited thereto, and it will be understood that various changes in form and details may be made therein without departing from the spirit and scope of the following claims.

What is claimed is:

1. A lightning strike alarm system using a Bipolar Conventional Air Terminal (BCAT) comprising a rod element electrified by a ground charge, an electrification plate-cone or an electrification plate-tube electrified by a thunderstorm cloud, the lightning strike alarm system comprising:
    a sensor unit electrically connected to the rod element and the electrification plate-cone or the electrification plate-tube and configured to measure electric energy induced in the electrification plate-cone or the electrification plate-tube by the thunderstorm cloud; and,
    a controller configured to determine that the thunderstorm cloud has approached when the electrical energy measured by the sensor unit is greater than a reference energy set in advance;
    wherein the sensor unit comprises:
        a luminescence unit electrically connected to the rod element and the electrification plate-cone or the electrification plate-tube and configured to emit light by the electric energy induced in the electrification plate-cone or the electrification plate-tube;
        a light receiver configured to receive the light emitted from the luminescence unit, convert the light to electric energy, and transfer the electric energy to the controller; and
        a light shielding block configured to accommodate the luminescence unit and the light receiver and maintain an electric contact between the rod element and the electrification plate-cone or the electrification plate-tube, and to supply the electric energy induced in the electrification plate-cone or the electrification plate-tube to the luminescence unit.

2. The lightning strike alarm system of claim 1, wherein the luminescence unit comprises light emitting devices having different polarities and connected in parallel, the light emitting devices being configured to emit light even when currents of different polarities are input.

3. The lightning strike alarm system of claim 1, wherein the sensor unit further comprises:

a locking bolt configured to form a removable tensioning groove to fix and support an end of the light shielding block.

4. The lightning strike alarm system of claim 3, wherein light shielding block binding units with protruding structures, configured to cover and protect the light shielding block and the locking bolt, are additionally arranged in a circumferential direction of the electrification plate-cone or the electrification plate-tube.

5. The lightning strike alarm system of claim 4, wherein a fastening device to be complementarily removably attached to the electrification plate-cone or the electrification plate-tube is arranged in the light shielding block binding units.

6. The lightning strike alarm system of claim 1, wherein a terminal piece accommodation groove to accommodate a terminal piece on an end of the light shielding block in a length direction is arranged in a circumferential direction of the rod element.

\* \* \* \* \*